US008592765B2

(12) United States Patent
Forg et al.

(10) Patent No.: US 8,592,765 B2
(45) Date of Patent: Nov. 26, 2013

(54) THERMOPILE INFRARED SENSOR BY MONOLITHIC SILICON MICROMACHINING

(75) Inventors: Bodo Forg, Mainz (DE); Frank Herrmann, Dohna (DE); Wilhelm Leneke, Taunusstein (DE); Joerg Schieferdecker, Dresden (DE); Marion Simon, Bad Schwalbach (DE); Karlheinz Storck, Ingelhelm (DE); Mischa Schulze, Huenstetten (DE)

(73) Assignee: HEIMANN Sensor GmbH, Dresden (DE)

( * ) Notice: Subject to any disclaimer, the term of this patent is extended or adjusted under 35 U.S.C. 154(b) by 312 days.

(21) Appl. No.: 13/005,853

(22) Filed: Jan. 13, 2011

(65) Prior Publication Data
US 2011/0174978 A1    Jul. 21, 2011

(30) Foreign Application Priority Data

Jan. 18, 2010 (DE) .......................... 10 2010 004 938
Oct. 7, 2010 (DE) .......................... 10 2010 042 108

(51) Int. Cl.
*G01J 5/12* (2006.01)
(52) U.S. Cl.
USPC ................................................... 250/338.1
(58) Field of Classification Search
USPC ................... 250/338.3, 338.1, 338.4
See application file for complete search history.

(56) References Cited

U.S. PATENT DOCUMENTS

| | | | |
|---|---|---|---|
| 4,472,239 A | 9/1984 | Johnson et al. | |
| 4,654,622 A | 3/1987 | Foss et al. | |
| 4,853,538 A * | 8/1989 | Jackson | 250/336.2 |
| 5,962,854 A * | 10/1999 | Endo | 250/349 |
| 6,342,667 B1 | 1/2002 | Shen et al. | |
| 7,040,806 B2 * | 5/2006 | Ishikawa et al. | 374/120 |
| 7,345,278 B2 * | 3/2008 | Honda et al. | 250/338.1 |
| 2003/0054179 A1 | 3/2003 | Nakajima et al. | |
| 2003/0168598 A1 * | 9/2003 | Oda | 250/338.1 |
| 2008/0216883 A1 * | 9/2008 | Leneke et al. | 136/224 |
| 2009/0184246 A1 * | 7/2009 | Abe | 250/338.4 |

FOREIGN PATENT DOCUMENTS

| | | |
|---|---|---|
| DE | 40 91 364 C1 | 7/1993 |
| DE | 198 43 984 A1 | 3/2000 |
| DE | 693 29 708 T2 | 5/2001 |
| DE | 102 60 408 A1 | 7/2003 |
| DE | 199 54 091 A1 | 9/2005 |
| EP | 0 869 341 A1 | 10/1998 |
| EP | 0 599 364 B1 | 11/2000 |
| JP | 04006424 A * | 1/1992 |
| JP | H11337403 A | 12/1992 |
| JP | H07120308 A | 5/1995 |
| JP | 2000111396 A | 4/2000 |
| JP | 2006184151 A | 7/2006 |
| JP | 2007139445 A | 6/2007 |

* cited by examiner

*Primary Examiner* — Constantine Hannaher
(74) *Attorney, Agent, or Firm* — Heslin Rothenberg Farley & Mesiti P.C.

(57) ABSTRACT

A thermal infrared sensor is provided in a housing with optics and a chip with thermoelements on a membrane. The membrane spans a frame-shaped support body that is a good heat conductor, and the support body has vertical or approximately vertical walls. The thermopile sensor structure consists of a few long thermoelements per sensor cell. The thermoelements being arranged on connecting webs that connect together hot contacts on an absorber layer to cold contacts of the thermoelements. The membrane is suspended by one or more connecting webs and has, on both sides of the long thermoelements, narrow slits that separate the connecting webs from both the central region and also the support body. At least the central region is covered by the absorber layer.

22 Claims, 7 Drawing Sheets

2a)

2b)

2a)     2b)

5a)

5b)

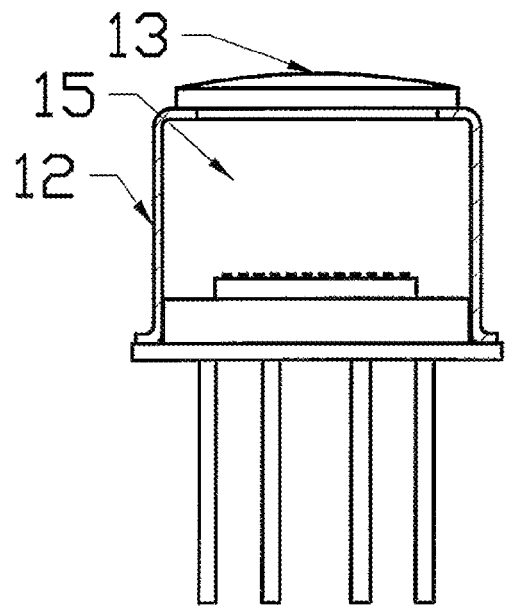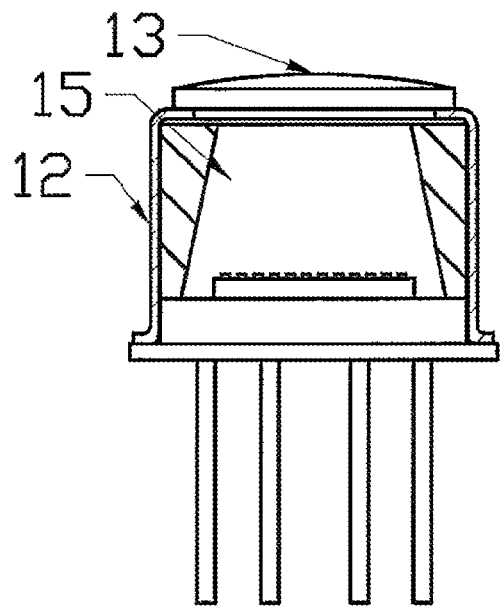
Fig. 8A　　　　　　　　Fig. 8B
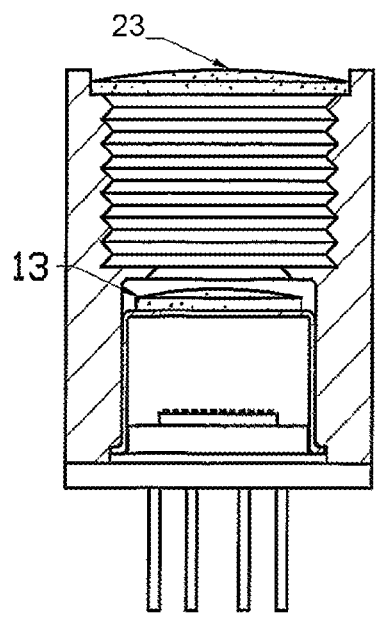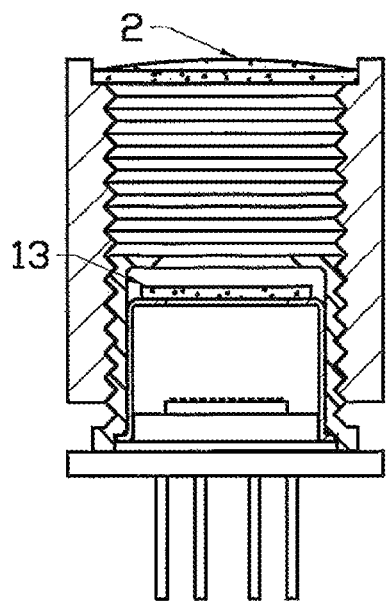
Fig. 9A　　　　　　　　Fig. 9B

THERMOPILE INFRARED SENSOR BY MONOLITHIC SILICON MICROMACHINING

CROSS REFERENCE TO RELATED APPLICATIONS

This application claims priority of German Application No. 10 2010 004 938.7 filed on Jan. 18, 2010 and German Application No. 10 2010 042 108.1 filed on Oct. 7, 2010, which applications are hereby incorporated by reference herein in their entirety.

BACKGROUND ART

The invention relates to a thermal infrared sensor in a housing with optics and a chip with thermoelements in the form of thermopile, bolometer or pyroelectric sensor structures on a membrane, which spans a frame-shaped support body that is a good heat conductor, wherein the support body has vertical or approximately vertical walls.

There exist infrared sensors that can be produced in a variety of variants using silicon micromachining technology.

For example, US 2003/0054179 A1 introduces a sensor cell for, inter alia, thermopiles, with a thin membrane and an absorber affixed thereon.

The support substrate beneath the sensor structure is mechanically recessed by means of a wet chemical etching process of surface micromachining. In this etching process slits are etched into the membrane. This wet etching process produces inclined walls. In no case does the depth of the clearance reach the complete depth of the substrate. That means that the smaller the sensor structure in its lateral dimensions, the smaller the etching depth.

If a high vacuum is not used, then the thermal conductivity of the residual gas or the fill gas in the sensor housing reduces the temperature differential that can be attained between the absorber region—that is, the "warm contacts"—and the heat sink—that is, the support substrate.

If the absorbed IR radiation produces a smaller temperature differential, then the sensitivity that the sensor cell can attain is also reduced. The use of a fill gas is not described.

Kanno, T. et al. (NEC Corp.): "Uncooled focal plane array having 128×128 thermopile detector elements" in B. Andersen (editor), Infrared Technology, Proc. SPIE 2269, Vol. XX, San Diego, July 1994, pp. 450-459 describe a monolithic thermopile sensor array, in which the sensor elements are produced by surface micromachining technology with a sacrificial coating. The distance between the sensor structure and the heat sink in the substrate is significantly less than the substrate thickness itself. The solution permits a relatively good resolution capacity only for the case that the sensor chip is capped in the high vacuum sealed housing. In contrast, the cost effective housing structures under low residual gas pressure or with a fill gas do not produce an adequately high sensitivity.

Both DE 693 29 708 T2 and EP 0 599 364 B1 relate to a fabrication process for infrared radiation sensors, wherein the sensitivity is enhanced through the use of a vacuum housing or a housing that is filled with a gas that is only slightly heat conductive.

The engineering object of this fabrication method is to be able to provide a vacuum or a gas exchange without damaging the membrane, on which is located the sensor element, due to the pressure differentials. In this case the crucial factor is that the gas exchange in the cavity below the membrane is approximately 300 torr as the burst pressure differential for the silicon oxide/silicon nitride membranes that are used.

In addition to recesses in the bottom plate and spacers of different shapes, there are also apertures in the membrane as ventilation methods.

All of the drawings show wet etched, inclined trench walls. Between the base plate and the substrate there is a ventilation gap, which serves preferably to compensate for the pressure between the region above and below the membrane.

The proposed solution exhibits slits in the membrane that, however, do not permit optimal use of the available area, because such utilization is prevented by the illustrated etching process with the inclined walls. The influence of a slitted membrane on the thermal conditions in the chip is not taken into consideration.

The patent DE 102 60 408 A1 describes a thermal radiation sensor array comprising a slitted thermopile array. The basis is the stacking of a number of thermopile arrays one above the other. The slits are not used to enhance the sensitivity, but rather so that the sub-arrays can always be "seen" through the slits of the array lying above.

The intent is to increase the resolution capacity of the system in this way. However, the described arrangement exhibits a plethora of drawbacks. The process costs rise by a factor of the number of stacked linear arrays that are used; similarly the exact alignment of the individual chips that are stacked one above the other and their connection to each other also means a high technological complexity and financial outlay, and the pixels can be used only to achieve a linear array, because they are not square and are, thus, unsuited for generating a two-dimensional infrared image. Furthermore, the membrane is structured by rear sided, anisotropic wet etching, a technique that results in a considerable enlargement of the sensor structure owing to the inclined walls of the heat sink. Only the slits are dry etched by reactive ion etching (RIE). The aforementioned pairing of materials for the thermopiles (bismuth/antimony) and the absorber material (silver black coating) are barely compatible with the CMOS process. Another drawback is the high temperature dependence of the sensitivity of the aforementioned material pairing. It must also be added that the targeted multiplication of the resolution capacity is always limited by the optical system, because the individual sub-arrays lie in different sharpness planes and, therefore, the only alternative is a compromise in the choice of the focal distance on the image side. A gas filling and/or a housing surrounding the sensor cells with reduced inner pressure in order to enhance the sensitivity owing to the reduced thermal conductivity of the gas, is not described.

A monolithic thermopile sensor array, which is produced by bulk Si micromachining technology, is described in the HORIBA product information: "8×8 element thermopile imager," in Tech Jam International, Sep. 26, 2002. The 64 elements are situated on an 8×8 mm chip, each element being separated thermally by Si walls by the wet etching technology. The size of the chip as a function of the process leads to relatively high manufacturing costs and again stands in the way of cost effective mass applications.

In addition to these thermopile solutions, there are other solutions for low cost infrared arrays.

U.S. Pat. No. 4,472,239 A and U.S. Pat. No. 4,654,622 introduce thermal sensor structures with a thin membrane and slits for etching out parts of the support substrate lying underneath. In both cases the underneath recesses reach only a shallow depth, a state that allows, as in the case of the solutions described above, just a slight sensitivity with simultaneously cost effective housing solutions without high vacuum sealing.

DE 199 54 091 A1 and U.S. Pat. No. 6,342,667 describe thermopile sensor cells, in which the recess beneath the sensor structure is freely etched by means of slit structures in the form of large triangles in the edge region of the membrane or in the form of a cross in the center of the membrane. In both cases the results are produced by a wet etching process that does not permit the occurrence of large distances from the heat sink owing to the inclined walls. A plurality of parallel arranged thermoelements prevents large temperature differentials between the hot and cold contacts and, thus, a high signal sensitivity cannot be obtained.

DE 198 43 984 A1 introduces cells of infrared radiation sensors. The embodiment in FIG. 1 has vertical walls that run through the entire substrate. However, it also describes a plurality of more likely "short" thermoelements that do not—as stated above—permit a high sensitivity. The other exemplary embodiments in FIG. 2 e) and FIG. 3 a) introduce once more surface micromachining solutions for generating the recess, where the etching is performed through an aperture in the membrane. The depth of the etching can range from 50 to 200 µm. Again the short distance between the sensor structure and the heat sink of max. 200 µm does not enable high sensitivities owing to the heat conductivity of the gas. Possibilities for reducing the heat conductivity by means of gases of low conductivity or reduced pressure are not described.

EP 0 869 341 A1 introduces monolithic bolometer structures for an infrared sensor array. In the case of these bolometer structures the sensor elements are produced by means of surface micromachining technology, where the removal of a sacrificial coating results in sensor bridges that exhibit very good thermal insulation at approximately 2.5 µm above the Si substrate that contains the evaluation circuit.

In the meantime such infrared bolometers with sensor bridges have become available in many variants. Because they permit very small element dimensions, they are widespread in high-resolution infrared arrays. In principle, despite the small sensor element dimensions, very good temperature resolutions are achieved with this method.

However, the small element dimensions on the silicon surface automatically require high vacuum sealed packaging of the sensor chip, a feature that once again is at variance with cost effective mass production. The possibility of sealing this chip in a cost effective housing with gases of low thermal conductance under normal pressure conditions would drastically reduce the attainable sensitivity.

DE 40 91 364 C1 introduces a thermopile sensor cell with a thin membrane and slitted structure. The absorber region is held via a long beam and a few thermoelements. The membrane can have holes or slits. The beam that has the thermoelements and that can exhibit a width of 130 µm is insulated from the substrate edge and the absorber region by means of slits that are also quite wide.

The support substrate that lies beneath the sensor structure is wet etched from the rear side—with suitably inclined walls in the substrate. A filling operation with protective gas is provided.

In principle, higher temperature differentials and sensitivities can be achieved with such a solution. However, the wide slits prevent optimal utilization of the available area (degree of filling) of the sensor cell. The wet etched recess in the support substrate exhibits walls that run towards the outside; the whole sensor cell is supposed to be about 2×2 mm in size. The inclined substrate walls that run towards the outside do not permit any small sensor cells or short distances between the cells (array structures).

Working on this basis, the prior art solutions propose thermal infrared sensor cells that do not permit a cost effective production of thermal infrared sensor cells exhibiting a high sensitivity and simultaneously a high degree of filling and simple housing technology without a high vacuum sealed housing closure either for reasons relating to the large area chip technology or too little distance between the sensor structure (absorber region) and the support substrate located underneath or for reasons relating to the costly vacuum housing technology.

BRIEF SUMMARY OF THE INVENTION

The object of the invention is to provide a thermopile infrared sensor in monolithic silicon micromachining technology, where said infrared sensor has a high thermal resolution capacity with a small chip size, a high degree of filling and a high response rate and can be operated under gas at normal pressure or reduced pressure and can be mass produced cost effectively with standard CMOS processes without expensive technologies for the housing closure under ultra high vacuum.

The problem, on which the invention is based, is solved with a thermopile infrared sensor of the type described in the introductory part in that the thermopile sensor structure consists of a few long thermoelements per sensor cell, said thermoelements being arranged on connecting webs that connect together the hot contacts on an absorber layer on the membrane to the cold contacts of the thermoelements; that the membrane is suspended by way of one or more connecting webs; that the membrane has on both sides of the long thermoelements narrow slits that separate the connecting webs both from the central region and also from the support body; and that at least the central region is covered by the absorber layer.

The invention provides a thermopile sensor structure that possesses an especially high signal sensitivity and enables a high degree of filling.

In a first embodiment of the invention the thermoelements on the long narrow connecting webs are led around the absorber region. In this respect the length of a connecting web is equivalent to at least half the length, preferably the whole side length of the absorber region.

An additional embodiment of the invention is characterized in that the thermoelements on the long narrow connecting webs are led around the absorber region. In this case the length of a connecting web is equivalent to the entire side length up to double the side length of the absorber region.

Furthermore, it can be provided that the thermoelements on long, narrow connecting webs are led around the absorber region. In this case the connecting webs exhibit at least one reversal point. This strategy makes it possible to obtain a meander shape of the connecting webs that, as a result, exhibit a greater length.

A particular embodiment of the invention provides that the narrow connecting webs with the hot ends of the thermoelements are brought forward from many sides to the absorber region.

The thermopile sensor structures are made preferably of n- and p-conducting polysilicon produced in a CMOS process.

In order to obtain a low "thermal mass" and high response rate, the insulation and passivation coatings produced over the thermopile structures during the semiconductor process are removed again to some extent from the top side.

In order to increase the filling degree, the thin absorber layer also covers at least partially the connecting webs and preferably even the entire connecting web and extends to just before the cold contacts.

For thermal compensation the membrane in the absorber region can be filled with one or more polysilicon layers.

In an additional continuation of the invention the polysilicon layers in the absorber region are structured in such a way that they are reduced in size in order to reduce the thermal mass. For example, they exhibit the shape of a cross that starts from the center of the absorber layer, and in this case the ends of the cross enclose the "hot" contacts of the thermopile structures or they touch them only on one side, in order to avoid short circuits.

Furthermore, it is provided that the long, thin connecting webs with the thermoelements are connected to the adjacent substrate body at least at one point by means of a stabilization web.

In an additional embodiment of the invention several sensor cells are arranged in a closely spaced manner in linear or array form on the same sensor chip. In this case at least one portion of the signal processing is integrated on the same semiconductor substrate, or each sensor cell exhibits an electronic signal processing unit per single cell or at least per four single cells together.

In the simplest case the optics of the thermopile infrared sensor structure can be a filter disk or an imaging lens.

The optics can also consist of a first lens, which is rigidly installed in the housing, and a second lens that is located outside the housing, wherein both lenses together produce the optical imaging.

As an alternative, the optics consist of a first lens, which is rigidly installed in the housing, and a second lens that is located outside the housing, wherein the second lens does not have to be mounted gas tight, but rather can be interchangeable.

Finally the optics can consist of a first lens, which is rigidly installed in the housing, and a second lens that is located outside the housing, wherein the second lens can be adjustable at a distance from the sensor element by means of an adjusting mechanism.

BRIEF DESCRIPTION OF THE DRAWING FIGURES

The invention is described by means of the following figures.

Figure 3:
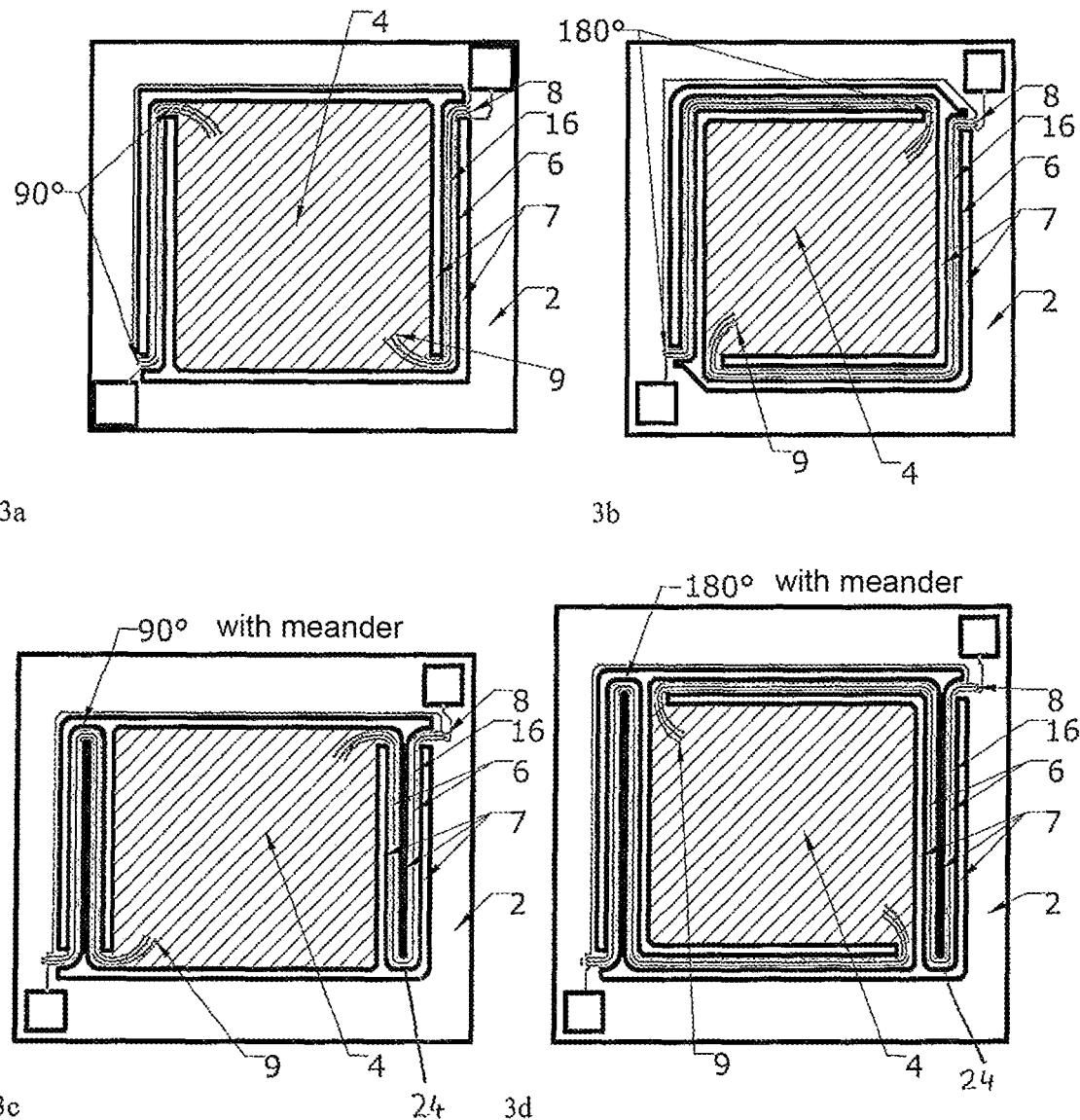
Figure 4:
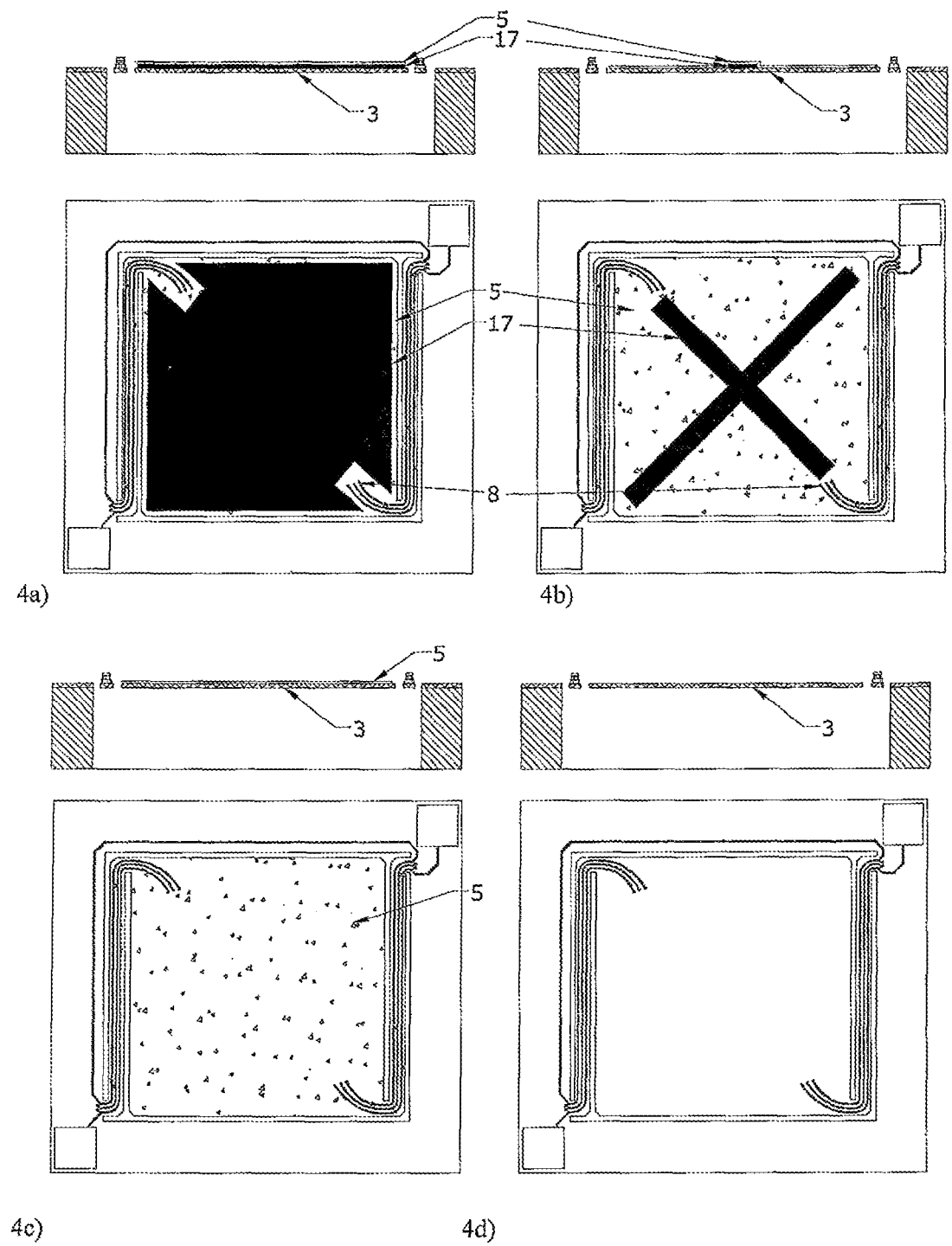
Figure 5:
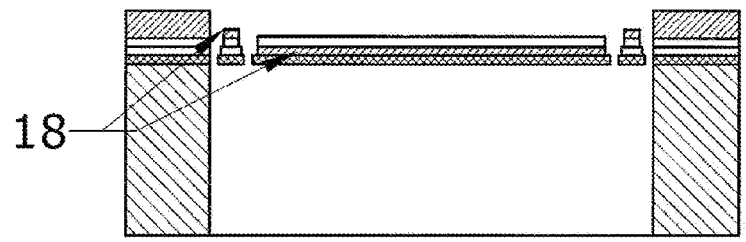
Figure 5:
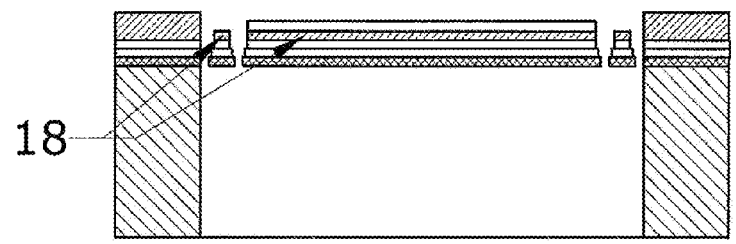
Figure 6:
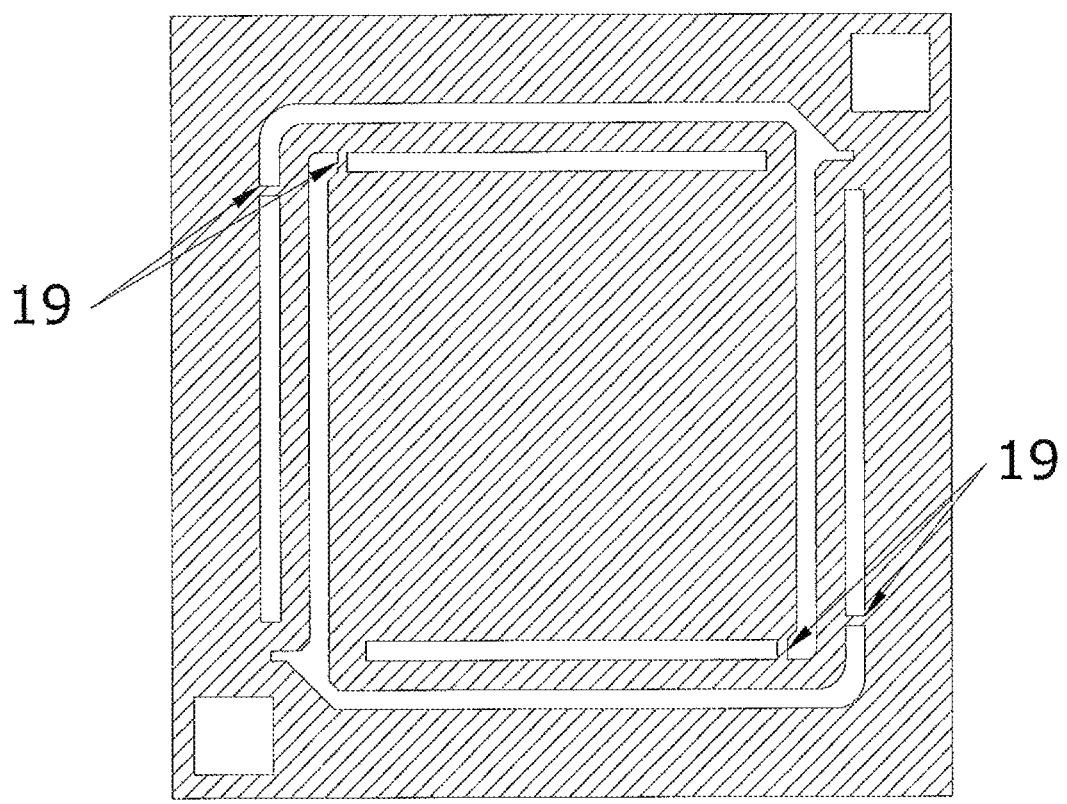
Figure 7:
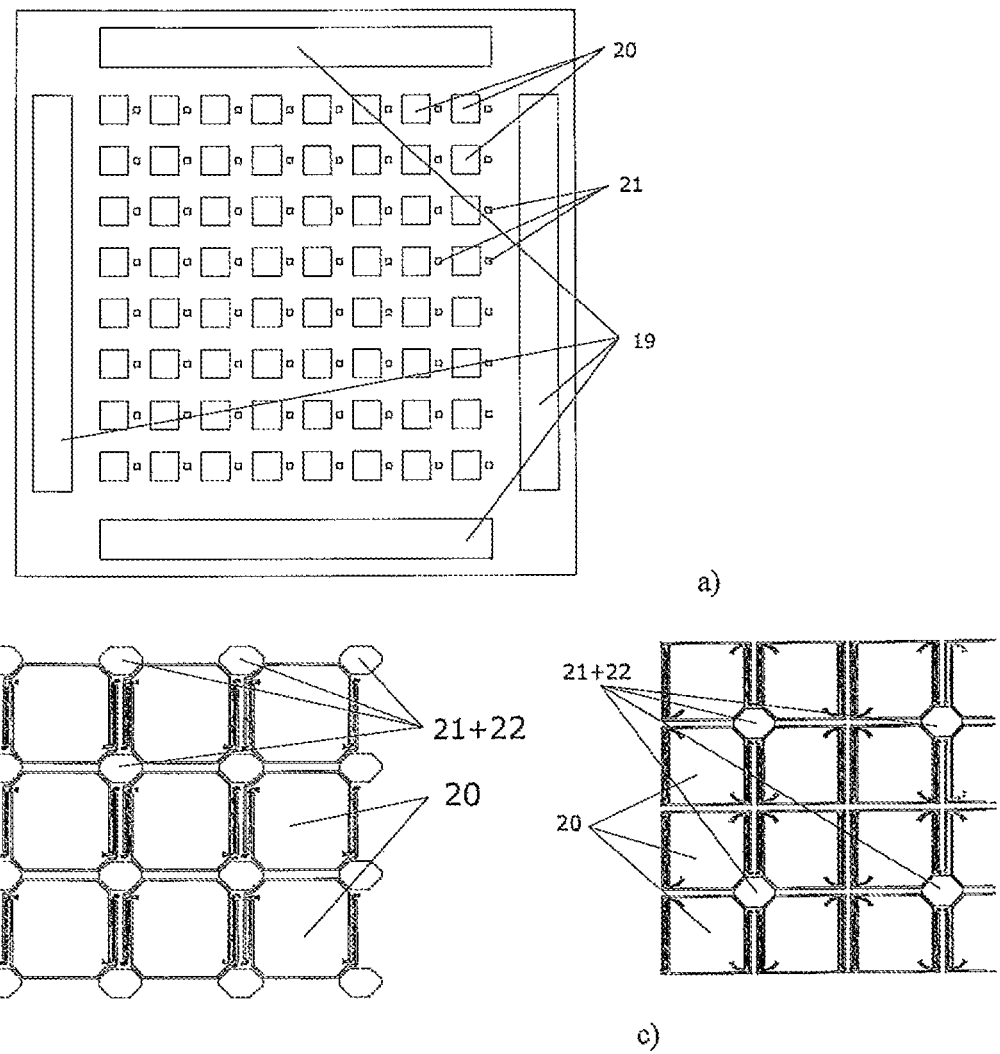

FIGS. 3 a)...d) show a top view of an inventive thermopile sensor cell with various embodiments for the slits and the webs;

FIGS. 4 a)...d) show a top view of an inventive thermopile sensor cell with various embodiments for the central absorber region;

FIGS. 5 a, b) show a cross sectional view of an inventive thermopile sensor cell with thinned passivation layers;

FIG. 6 shows an embodiment with stabilization ribs between the absorber region and the web and/or substrate;

FIG. 7 shows an additional embodiment of an inventive sensor cell with a plurality of elements and different embodiments for housing the on-chip signal processing a) with a signal electronics unit in the edge region b) with one signal electronics unit each per sensor element and c) with one signal electronics unit each for the respective 4 sensor elements;

FIGS. 8 a, b) show additional embodiments of the inventive sensor cell with various embodiments of the optics with internally and externally mounted optics; and FIGS. 9 a, b) show an embodiment with a second lens at a variable distance.

DETAILED DESCRIPTION

Figure 1:
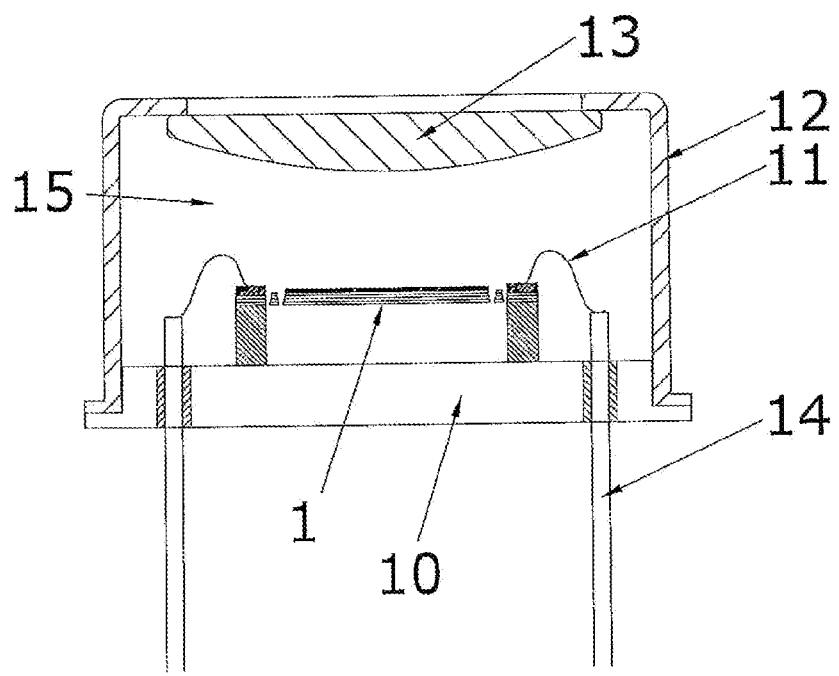
FIG. 1 shows the basic structure of an infrared sensor according to the invention.
Figure 2:
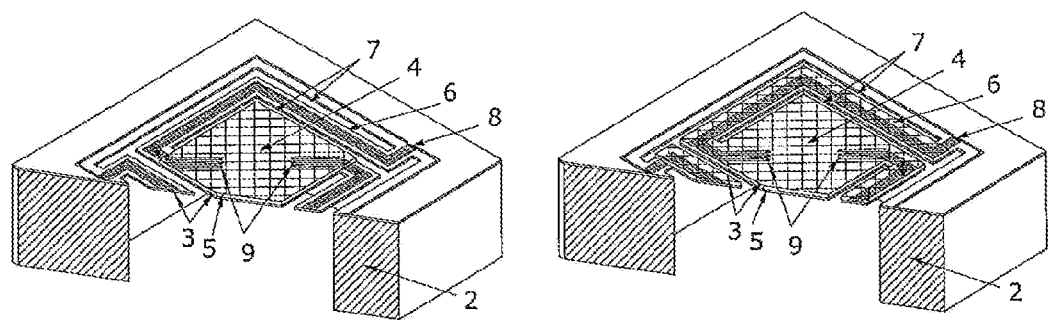
FIG. 2 shows a detail of the infrared sensor with the thermopile sensor cell according to the invention a) with the absorber layer in the central region and b) with the absorber layer over the central region and webs.

FIGS. 1 and 2 show the basic structure of an infrared sensor according to the invention. The sensor cell 1 (chip) with a support body 2, a membrane 3, a central sensitive region 4 with an absorber layer 5 and connecting webs 6 is mounted on a bottom plate 10, which in turn is closed with a cap 12. In the cap 12 above the sensor cell there are optics 13 for the passage or focusing of the infrared radiation from the object to the absorber 5. The support body 2 consists of a substrate made of a semiconductor material (for example, silicon). This substrate beneath the sensor elements is completely hollowed out by etching from the back side, so that only thin, vertical or almost vertical separating walls of the semiconductor substrate material remain in the region between the thermo elements 16.

The electrical connections of the sensor cells on the chip 1 are run via the connecting wires 11 to the external connections 14. This configuration can be carried out both on metal bottom plates 10 (such as transistor housings) and non-metal bottom plates 10 (for example, printed circuit boards or ceramic circuit boards).

The medium enclosed in the housing is a gas or a gas mixture 15. According to the invention, this gas 15 has a thermal conductivity that is less than that of air or nitrogen, in order to hold the convection from the central region 4 (absorber region) of the membrane 3 (hot contacts) to the support body 2 (cold contacts) as low as possible.

Preferably this goal is reached through the use of a gas 15 having a high molar mass—for example, xenon, krypton or argon—or a gas having an internal pressure, which is drastically reduced compared to normal atmospheric pressure, above the ultra high vacuum. Thus, the housing must be sealed in such a way that no gas exchange with the environment occurs.

FIG. 2 shows the inventive configuration of the infrared sensitive sensor cell 1 inside the sensor housing itself. On the support body 2 (substrate) made of silicon or another semiconductor material there is on the top side of the support body a thin membrane 3 with a central region 4, which is suspended by one or more thin connecting webs 6. The connecting webs 6 are separated from both the central region 4 and also from the support body 2 by narrow slits 7 of the invention.

Thermal sensor structures for converting the infrared radiation into a measurable quantity are located on the central region 4 and the connecting webs 6. These sensor structures can be, for example, well-known pyroelectric and/or thermoelectric structures or bolometer structures.

The invention is explained below by means of thermoelectric sensor structures—the so-called thermopiles. These thermopiles have "cold" contacts 8 above the substrate body, which serves as the heat sink and has vertical walls, and the so-called "hot" contacts 9 on the central absorber region.

The infrared radiation, absorbed on the absorber region, heats the "hot" contacts 9 as opposed to the "cold" contacts 8, insofar as the object, which is to be measured and which is located outside the sensor housing, has a higher temperature than the heat sink (substrate body 2). In the opposite case the absorber region cools down and the result is a negative temperature differential. The thermoelectric sensor structures produce a signal voltage that is proportional to the temperature difference between the hot and the cold contacts.

In order to enhance the measurement sensitivity (signal voltage) of the sensor cell, the hot contacts 9 have to be thermally especially well insulated from the heat sink 2 and simultaneously the size of the absorbing region should be as large as possible in comparison to the whole cell.

The invention achieves this objective by configuring the length of the thermocouples 16 especially long in that the thermocouples are not connected, as is usually the case, on the straight and direct path to the cold contacts 8, but rather via the detour of long and narrow connecting webs 6 (see FIGS. 3*a* to 3*d*). Whereas conventional thermopile sensors exhibit a large number of individual thermocouples 16 (typically 40 . . . 80, in some cases over 100 thermo pairs per single cell), the invention has only a small number of maximally 20, typically fewer than 10 thermoelements per single cell. The slits 7, which separate the webs from the support substrate and from the central absorber region, have a maximal width of 10 μm, preferably even <3 μm, in order to obtain a high utilization of the available area.

The sensor cells are fabricated, for example, in a cost effective CMOS process. The thermoelements 16 (also called thermocouples) are made preferably of n- and p-conducting silicon, germanium or a mixture thereof and have a thickness of less than 1 μm. The walls of the support body 2 are vertical or almost vertical and extend preferably as far as the bottom of the support body. They are produced by a so-called micromechanical manufacturing technology (also known as MEMS) and used for MEMS (micromechanical systems).

The preferred method is, for example, the reactive ion etching (so-called deep RIE process), wherein the etching is performed from the underside of the support body through the whole substrate as far as the membrane.

The absorber layer 5, which is used for maximum absorption of the infrared radiation of the object to be measured, is itself very thin, preferably <<1 μm, in order to obtain a low thermal mass of the absorber region and, thus, a fast response rate of the sensor elements (FIG. 4). Frequently the absorber layer 5 also acts together with the layers that lie underneath on the thin membrane 3. The absorber layer 5 is produced by a CMOS-compatible process.

For single element sensor cells with a small measuring spot, the absorber 5 can be limited to the central region 4 outside the webs. For multi-element structures (see also FIG. 7), the absorber 5 can also be expanded to include all of the connecting webs 6 or at least a portion thereof (FIG. 2*b*), in order to increase the filling factor.

Embodiments for the cell geometry—especially for the shape of the webs 6 with the thermocouples 16 and the insulation slits 7—are described below. FIGS. 3*a* to 3*d* show several inventive embodiments for the connecting webs 6 with the thermocouples 16.

Usually the central region 4 is connected to the support body 2 by way of two or four connecting webs 6. At the same time the connecting webs 6 should exhibit at least the length of half a side of the central region 4. Typically the web length is the length of one side (so-called 90 deg. version FIG. 3*a*) or two side lengths (so-called 180 deg. version FIG. 3*b*) of the central region 4.

FIG. 3*b*) shows such longer webs via two sides of the central region 4 (180 deg. version). Additional embodiments have even longer connecting webs 6, which are achieved by the fact that the shape of the web exhibits a turning point 24, as a result of which the direction of the web reverses and the web assumes a meander shape. FIG. 3*c* shows a 90 deg. version with a meander shaped connecting web 6 and FIG. 3 *d*) shows a 180 deg. version with a meander shaped connecting web 6.

In principle, other solutions between a) . . . d) are also conceivable—for example, connecting webs 6 with ½ side length or 1½ side lengths. In addition, other meanders can also be integrated into the connecting webs 6, in order to extend even more the length of the connecting web 6. The one or the other variant has its advantages as a function of the size of the cell, the attainable response rate, the pressure and the type of gas in the housing, as well as the thermal resolution.

FIG. 4 shows embodiments of the central region 4. FIGS. 4 *a*) to *d*) show inventive embodiments for the central region 4 with a, b) absorption layer and polysilicon compensating layers, c) absorption layer and d) without absorption and polysilicon compensating layer.

As stated above, the central region 4 of the membrane 3 is covered with an absorber layer 5 that can also be expanded to include the webs. The CMOS process provides the polysilicon layers, from which the thermocouples 16 are constructed. They can also be used in the central region, in order to achieve, in addition to the absorber layer 5, a good and fast thermal balance between the various regions of the absorber and the hot contacts.

The largest increase in temperature occurs typically in the middle of the central region 4. If, however, all of the thermocouples 16 were to be extended as far as the middle of the central region, then the internal electrical resistance of the thermoelements and, thus, the noise would increase.

Therefore, the polysilicon areas 17 can be used as the thermal compensating layer between the central region 4 and the hot contacts 8 that are situated further towards the outside. The hot contacts can also be distributed differently over the absorber. In this case the thermocouples become wider in order not to lower the internal resistance of the thermopile (not illustrated in FIGS. 3 and 4).

FIG. 4*a*) shows a version, wherein the whole central region 4 is covered with at least one polysilicon track 17. This approach makes it possible to achieve the maximum signal sensitivity at low noise (that is, the maximum detectability). The external polysilicon areas almost enclose the hot contacts. Preferably, however, a gap remains at least on one side in order to avoid short circuits.

In order to attain a high response rate, it may be advantageous not to expand the polysilicon areas 17 so as to include the entire central region 4, but rather only to extend from the center in a cross shaped or star shaped manner (see FIG. 4*b*). With this configuration it is possible to obtain a lower thermal mass of the central region and, thus, a higher response rate.

A high response rate at a high signal can also be obtained if the polysilicon layers 17 are omitted on the existing absorber layer (FIG. 4*c*). In this case the signal is somewhat smaller than with polysilicon compensating areas. A maximum response rate, but at a low signal, is obtained by omitting the absorber layer and the polysilicon layer 17.

An increase in the response rate at a high signal can be obtained if the passivation layers, produced during the CMOS process, in the region of the absorber and/or in the region of the absorber and the webs are totally or partially removed again (thinned) from the top side.

FIGS. 5 *a*) and *b*) show the reduced thickness of the passivation layers 18 in the absorber region as compared to the outer region above the silicon support body. The thinning is done by the well-known wet chemical or dry etching process from the front side of the chip.

One possibility for increasing the stability of the fragile membranes—especially in the case of multi-element structures—and, thus, the production yield consists of keeping the thin ribs 19 made of the membrane material between the connecting web 6 and the absorber region and/or the connecting web 6 and the support body 2. Then the etched gap 7 is interrupted at a few points specifically by the remaining ribs 19. FIG. 6 shows such ribs 19. The ribs 19 can be attached at different points of the connecting web—for example, even at all four corners of the absorber, a state that increases the mechanical stability of the arrangement.

In an additional embodiment the thermopile cells that have been introduced to date can also be combined to form an array structure with m lines and n columns. One example is shown in FIG. 7.

Since such an embodiment comprising many single elements on the same chip also needs an electronics unit on the chip side, FIG. 7 a) shows the individual thermopile cells 20 with a slitted membrane only as small squares for the sake of a better overview.

Such an electronics unit 20 and/or 22 that is in close proximity to the sensor can contain, for example, preamplifiers, low pass filters, multiplexers, address registers, analog/digital converters and interfaces. Suitable switching transistors 21 for selecting the individual sensor cell are located preferably next to each cell, but can also be arranged on the chip edge when the number of elements is small.

When the individual elements on a chip are arranged in the shape of a matrix, an especially advantageous effect can be achieved by the fact that the large area coverage with the absorber material 5 and the straight etching walls in the whole substrate 2 in interaction with the narrow slits 7 allow a high utilization of the available area. The result is that the filling factor that is important for array applications, the proportion of the radiation-absorbing and, thus, active area to the inactive area can be increased even more.

In order to operate the array structure, electronic modules have to be integrated into the substrate. In this case individual elements can be affixed inside the matrix of sensor elements, for example, at the corner points between the elements. Other electronic modules, like preamplifiers, low pass filters, multiplexers, address registers, temperature references, voltage references, analog/digital converters and interface modules and the like can be housed in the edge region of the array structure.

Hence, outside the optically active region they have no negative influence on the filling factor. Furthermore, it is easier to dissipate to the outside the waste heat generated in the electronic components. For this embodiment it is especially important that all of the processes that are used are compatible with standard CMOS processes. Only if the materials that are used and the necessary processes do not conflict with the standard CMOS processes can the problem of integrating the described infrared sensitive sensor elements with the necessary read-out electronics as a monolithic system be solved.

This integration step also makes it possible to achieve the goal that the sensor control and the outputting of the sensor signals are carried out via a few inputs and outputs. This strategy dispenses with the costly wire bonding connections 11 and also facilitates a cost effective mass production of such array sensors.

If the on-chip electronics unit contains, besides the preamplifiers, also low pass filters, then the noise bandwidth of the system can be reduced and the signal-to-noise ratio can be increased, a feature that enhances the attainable detectability and the measurement accuracy.

FIG. 1 shows an inventive sensor chip in a housing. To that end, the described sensor chips are constructed as a single element or as an array structure on a bottom plate 10 that is a good heat conductor and is made, for example, of metal, ceramic or metal coated plastic (printed circuit board).

The necessary control inputs and signal outputs are connected to the electrical contact areas of the substrate support by preferably wire bonding connections 11. Then the sensor structure is tightly sealed with a cap 12 that is also a good heat conductor and is made preferably of nickel, aluminum or copper. The cap 12 has an optical window 13 of infrared transmissive material, through which the infrared radiation, which is to be detected, passes onto the sensor chip 1.

The interior of the sealed housing has an atmosphere of gas 15 at normal pressure or a residual gas at reduced pressure. The advantages of the described invention take effect when the thermal conduction of this atmosphere is significantly less than that of the normal atmosphere or a dry nitrogen atmosphere at normal pressure.

Two additional embodiments are presented. In the first embodiment the pressure of the surrounding gas is reduced. The best sensitivity is achieved when a vacuum housing structure is used, but intermediate steps are also conceivable. The drawback with the vacuum housing is that the entire housing must be absolutely hermetically gas tight and no change in the gas pressure may occur over several years. This approach necessitates a complex and, thus, costly housing technology.

In the second embodiment the housing is filled under normal pressure with a gas of lower thermal heat conduction, such as e.g. krypton or xenon. This approach also increases the sensitivity of the sensor, but the requirements with respect to the housing technology are lower.

The choice of embodiment as the vacuum housing or with a gas filling of a gas that is a poor heat conductor also has an effect on the optimization of the sensor chip design. Thus, simulation calculations show that the optimal number of thermoelements when using vacuum housing technology should be very low. Preferably no more than four to eight thermoelements per sensor element should be used in order to achieve a detectivity of the thermopile that is as high as possible. Then these thermoelements are distributed among the number of connecting webs 6 that support the membrane 3.

If, in contrast, a housing structure with a gas that is a poor heat conductor is chosen, then a higher number of thermoelements can be chosen. For the described invention the preferred number of thermoelements ranges from 6 to 16 elements per thermopile, if a filling of the sensor housing with Xe or Kr is anticipated.

The thermal time constant of the sensor is measured as the quotient of the thermal capacity of the sensitive region and the thermal conductance between the warm and the cold contacts 8, 9. If the increase in sensitivity and detectivity is achieved by reducing the thermal conductance, then the result is the drawback that the time constant rises and the response rate of the sensor drops.

For this reason it is very important that the absorber layer 5 of the invention results in not only a high absorption of the infrared radiation in the sensitive region, but also itself exhibits a negligible layer thickness and, thus, a small thermal mass.

FIG. 8 shows an embodiment of the sensor elements that are arranged in an array and wherein the optics 13 in the cap 12 are formed preferably by an infrared lens. Both the sensor chip and also the lens should be centered relative to each other inside the sensor housing. The height of the cap has to be adapted in such a way that the infrared radiation is sharply imaged on the sensor element. In principle, it is possible to use, instead of optics, also a filter disk. In that case the lens must be situated outside the housing.

The viewing region between the sensor and the lens is preferably not reflective and/or is provided with elements to reduce the scattered radiation. The atmosphere 15 in the sensor housing exhibits preferably a low heat conductivity.

The use of imaging optics together with the sensor elements that are arranged in an array permits a spatially resolved infrared measurement. Especially advantageous is the use of a spherical or aspherical plano-convex lens, which, on the one hand, can be manufactured cost effectively and, on the other hand, the plano-side represents a suitable sealing surface for installation in a gas-tight housing.

Depending on the atmosphere 15 inside the sensor housing, the installation of the lens 13 inside the cap 12 with the plano-side towards the outside or outside on the cap 12 with the plano-side towards the sensor interior may be more advantageous. The installation is carried out preferably in such a way that a pressure difference between the housing interior and the outer environment presses the sealing area of the lens 13 additionally against the cap 12.

The described embodiment can be expanded in that a second lens 23 is mounted at a predefined distance in front of the first lens 13 or the filter, thus achieving improved imaging properties (FIG. 9a). This second lens 23 can have any spherical or aspherical shape, depending on the desired optical requirements.

The tube between the first lens 13 and the second lens 23 must not exhibit any particular atmosphere and must not be gas or vacuum tight. The region between the two lenses 13, 23 can be open to the normal atmosphere. The region between the two lenses 13, 23 is preferably not reflective and is made of a material that is a good heat conductor.

In another embodiment the distance between the second lens 23 and the lens 13, mounted in the cap 12, and/or the window can be changed so that the imaging properties of the imaging optics change (FIG. 9b). In principle, the optics can also be constructed of an imaging mirror inside or outside the cap in connection with a sealing filter or a sealing lens in the cap (not illustrated).

The invention claimed is:

1. Thermal infrared sensor in a housing with optics and a sensor chip having at least one sensor cell producing a signal voltage proportional to a temperature difference between hot and cold contacts of a thermopile sensor structure, comprising: a membrane spanning a heat conducting frame-shaped support body, wherein the support body has vertical or approximately vertical walls, and is completely hollowed out beneath the membrane; a thermopile sensor structure including a few long thermocouples per sensor cell, said thermocouples being arranged on connecting webs that connect together hot contacts on an absorber layer on the membrane to cold contacts of the thermocouples on the support body along indirect paths; wherein the membrane is suspended by one or more of the connecting webs; the membrane has, on both sides of the long thermocouples, narrow slits that separate the connecting webs from both a central region of the membrane and also from the support body; at least the central region of the membrane is covered by the absorber layer; and the sensor cell is filled with a gas having a thermal heat conductivity at normal atmospheric pressure significantly lower than air or nitrogen.

2. Thermal infrared sensor as claimed in claim 1, wherein the thermocouples on the connecting webs are led around the central region, and length of a connecting web is equivalent to at least half a length of a side of the central region.

3. Thermal infrared sensor, as claimed in claim 1, wherein the thermocouples on the connecting webs are led around the central region, and length of a connecting web is equivalent to an entire side length up to double the side length of the central region.

4. Thermal infrared sensor, as claimed in claim 3, wherein the length of a connecting web is equivalent to at least double the side length of the central region.

5. Thermal infrared sensor, as claimed in claim 1, wherein the thermocouples on the connecting webs are led around the central region, and the connecting webs exhibit at least one reversal point.

6. Thermal infrared sensor, as claimed in claim 1, wherein the connecting webs are brought forward from many sides to the central region.

7. Thermal infrared sensor, as claimed in claim 1, wherein the thermopile sensor structures comprises n- and p-conducting polysilicon produced in a CMOS process.

8. Thermal infrared sensor, as claimed in claim 7, wherein insulation and passivation coatings, produced over the thermopile sensor structures in the CMOS process, are removed again to some extent from a top side.

9. Thermal infrared sensor, as claimed in claim 1, wherein a thin absorber layer for increasing degree of filling covers, at least partially, the connecting webs.

10. Thermal infrared sensor, as claimed in claim 1, wherein the membrane in the central region is filled with one or more polysilicon layers.

11. Thermal infrared sensor, as claimed in claim 10, wherein the polysilicon layers in the central region are structured in a shape of a cross that starts from a center of the absorber layer and ends of the cross enclose the hot contacts or touch the hot contacts only on one side.

12. Thermal infrared sensor, as claimed in claim 1, wherein the connecting webs with the thermocouples are connected to the substrate body and/or the central region at least at one point by a stabilization web.

13. Thermal infrared sensor, as claimed in claim 1, wherein several sensor cells are arranged in a closely spaced manner in linear or array form on the same sensor chip.

14. Thermal infrared sensor, as claimed in claim 13, wherein the sensor cells, which are arranged in linear or array form, exhibit in each case an electronic signal processing unit per single cell or at least per four single cells together.

15. Thermal infrared sensor, as claimed in claim 1, wherein the support body comprises a hollowed out semiconductor substrate, several sensor cells are arranged in a closely spaced manner in linear or array form on the same sensor chip and at least one portion of a signal processing unit is integrated on the semiconductor substrate.

16. Thermal infrared sensor, as claimed in claim 1, wherein the optics comprises a filter disk or an imaging lens.

17. Thermal infrared sensor, as claimed in claim 1, wherein the optics comprise a first lens rigidly installed in the housing, and a second lens located outside the housing.

18. Thermal infrared sensor, as claimed in claim 7, wherein the first lens is rigidly installed in the housing, the second lens is not mounted gas tight, but rather is interchangeable.

19. Thermal infrared sensor, as claimed in claim 17, wherein distance of the second lens from the thermopile sensor structure is adjustable by an adjusting mechanism.

20. Thermal infrared sensor, as claimed in claim 1, wherein the thermocouples on the connecting webs are led around the central region, and length of a connecting web is equivalent to a whole side length of the central region.

21. Thermal infrared sensor, as claimed in claim 1, wherein the connecting webs consist of two webs on opposite sides of the central region of the membrane.

22. Thermal infrared sensor, as claimed in claim 1, wherein said narrow slits have a width less than three μm.

* * * * *

UNITED STATES PATENT AND TRADEMARK OFFICE
CERTIFICATE OF CORRECTION

PATENT NO.         : 8,592,765 B2                                    Page 1 of 1
APPLICATION NO.    : 13/005853
DATED              : November 26, 2013
INVENTOR(S)        : Forg et al.

It is certified that error appears in the above-identified patent and that said Letters Patent is hereby corrected as shown below:

In the Claims

Column 12, Line 50: Claim 18, Delete "7" and insert --17--.

Signed and Sealed this
Eleventh Day of February, 2014

Michelle K. Lee
*Deputy Director of the United States Patent and Trademark Office*